United States Patent [19]

Hanaki et al.

[11] Patent Number: 4,847,215
[45] Date of Patent: Jul. 11, 1989

[54] METHOD FOR FORMING SILICON CARBIDE SEMICONDUCTOR FILM

[75] Inventors: Kenichi Hanaki, Kariya; Hitomi Kitagawa, Okazaki; Takayuki Tominaga, Okazaki; Tadashi Hattori, Okazaki, all of Japan

[73] Assignee: Nippon Soken, Inc., Nishio, Japan

[21] Appl. No.: 264,822

[22] Filed: Oct. 31, 1988

[30] Foreign Application Priority Data

Oct. 31, 1987 [JP] Japan ............................ 62-276278

[51] Int. Cl.$^4$ ..................... H01L 21/00; H01L 21/02; H01L 31/00; H01L 31/18
[52] U.S. Cl. ............................ 437/100; 148/DIG. 1; 148/DIG. 148; 204/192.25
[58] Field of Search ........ 437/100; 148/33.4, DIG. 1, 148/DIG. 148

[56] References Cited

U.S. PATENT DOCUMENTS

| | | | |
|---|---|---|---|
| 4,410,559 | 10/1983 | Hamakawa et al. | 357/2 |
| 4,499,331 | 2/1985 | Hamakawa et al. | 357/2 |
| 4,582,721 | 4/1986 | Yoshino et al. | 437/173 |
| 4,718,947 | 1/1988 | Arya | 437/101 |

FOREIGN PATENT DOCUMENTS

| | | | |
|---|---|---|---|
| 60-117711 | 6/1985 | Japan . | |
| 0199627 | 9/1986 | Japan | 437/100 |
| 62-154650 | 7/1987 | Japan . | |

OTHER PUBLICATIONS

Yoshihara, H; SiC Synthesis by a plasma deposition process; Thin Solid Films, vol. 76, No. 1, pp. 1-10, 1/30/81.
Characterization of High-Conductive p-Type A-SiC:H Producted by Highly Hydrogen Dilution (Hanaki, Hattori & Hamakawa) Nov./1987 pp. 49-52.
High-Conductive Wide Band Gap P-Type A-SiC;H Prepared by ECR CVD and its Application to High Efficiency A-Si Basis Solar Cells (Hattori, Kruangam, Katoh, Nitta, Okamoto and Hamakawa) May/1987 pp. 689-694.
Vidicon Mode Characterization of a-Si Solar Cells (Hamakawa, Okamoto and Talakura) Oct./1985 pp. 813-818.
a-Si Basis Heterojunction Stacked Solar Cells (Hamakawa, Matsumoto, Zhang-Yang, Okuyama, Takakura, Okamoto) Mat. Res. Soc. Symp. Proc. vol. 70, 1986 Materials Research Society.
Physics and Technologies of Efficiency Improvement for Amorphous Silicon Solar Cells, (Hamakawa) Aug. 1986-pp. 55-60.
Translation of Related Portions of Extended Abstract 29P-F-17 Valency Control of a-SiC:H prepared by ECR plasma CVD (Hattori, Kruangum, Toyama, Katoh, Okamoto and Hamakawa) Mar. 1987, pp. 1-2 and 251.

Primary Examiner—Brian E. Hearn
Assistant Examiner—B. Everhart
Attorney, Agent, or Firm—Cushman, Darby & Cushman

[57] ABSTRACT

A method for forming a SiC film having a wide optical energy gap and a high conductivity, which is capable of being stacked on a substrate of a large area uniformly. The SiC film is formed by supplying a material gas composed of monosilane gas, methane gas, diboran gas and hydrogen gas and having a hydrogen dilution ratio of about 144 and carbon mixing ratio of about 0.35, to the substrate, and supplying rf power of 60 to 270W(rf power density=80 to 350mW/cm$^2$) under a gas pressure of 0.2 torr at a substrate temperature of 220° C. The obtained film exhibits high dark-conductivity of $10^{-6}$Scm$^{-1}$ or more, and a Raman spectrum light thereof peaks at around 520 cm$^{-1}$.

5 Claims, 8 Drawing Sheets

F I G. 1
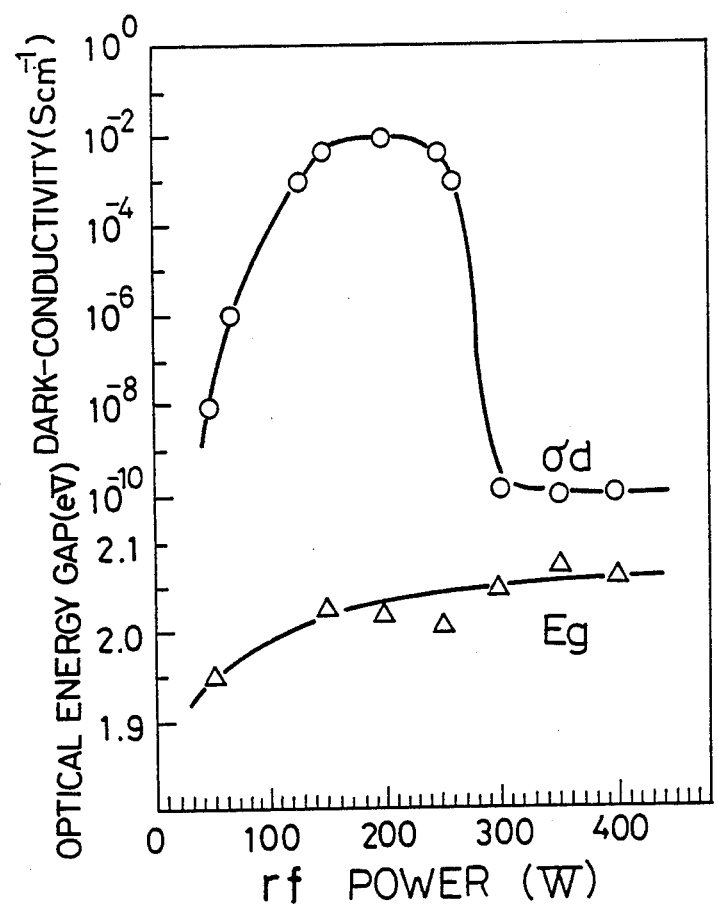

F I G. 5
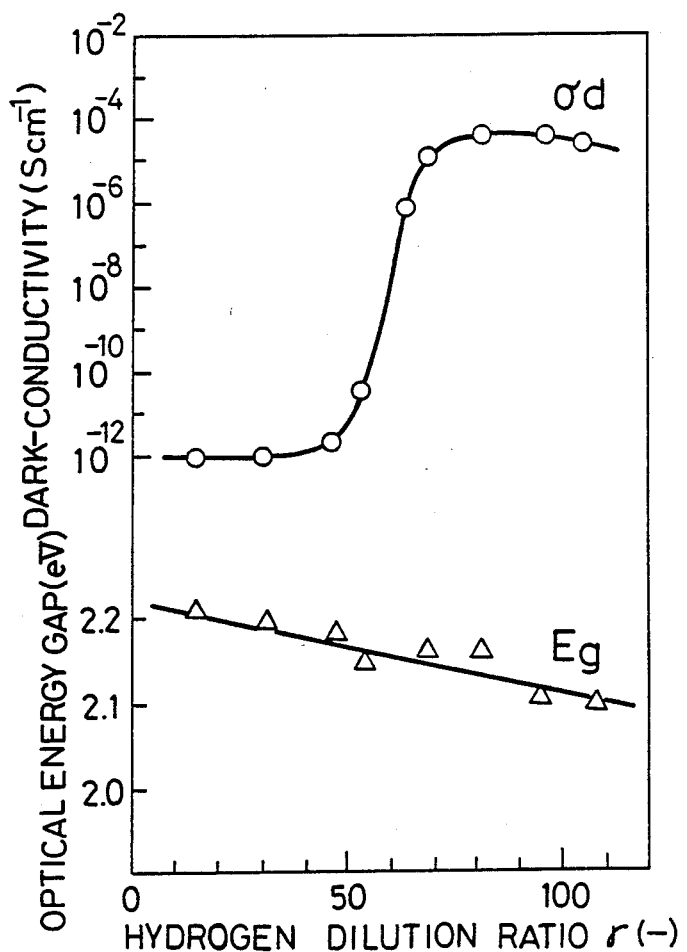

F I G. 8
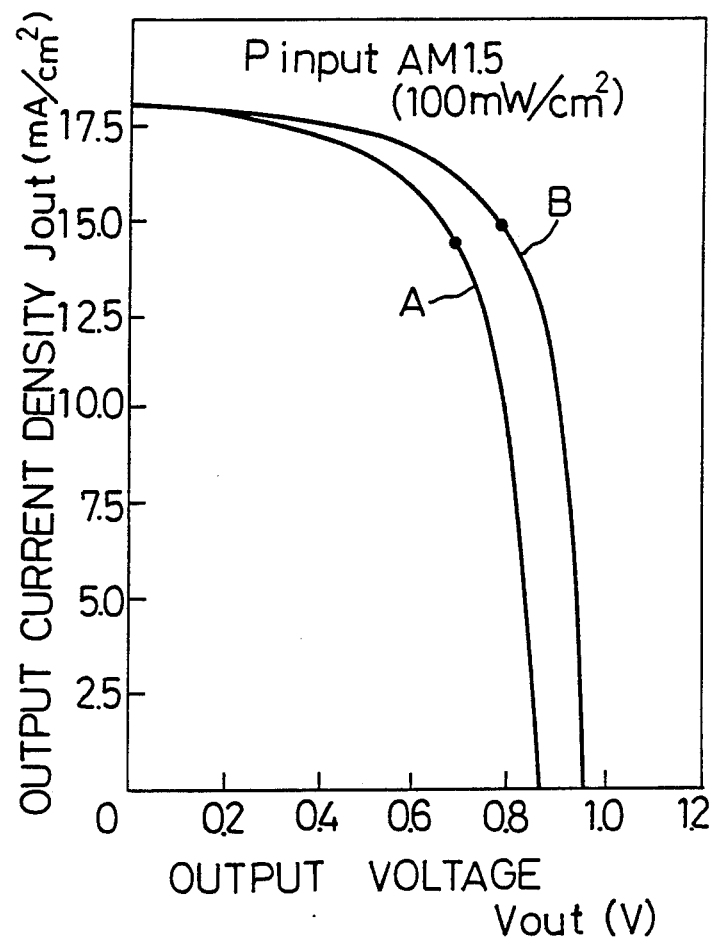

METHOD FOR FORMING SILICON CARBIDE SEMICONDUCTOR FILM

BACKGROUND OF THE INVENTION

1. Field of the Invention

The present invention relates to a method for forming a silicon carbide(SiC) film preferably employed in an amorphous solar cell or the like.

2. Description of the Prior Art

Conventionally a silicon carbide(SiC) film has been formed by radio-frequency(rf) glow discharge method.

The rf glow discharge method has the virtue of being formable a uniform film over a large area, which is required for the solar cell.

However, characteristics of the obtained SiC film are low since the film-forming conditions such as the flow ratio of a material gas and the rf power density are not proper. And even by doping the obtained SiC film with boron for improving the characteristics thereof, the obtained dark-conductivity is only about $10^{-5}$ through $10^{-8}$ Scm$^{-1}$ at the optical energy gap Eg of about 2.0 eV.

The SiC film employed in the amorphous solar cell is desired to have a wide optical energy gap in addition to a high dark-conductivity. However, the dark-conductivity tends to be lowered as the optical energy gap is increased. And at the optical energy gap of around 2.1 eV, the obtained dark-conductivity is only not more than $10^{-7}$Scm$^{-1}$.

In the case that the p-type amorphous SiC(a-SiC) film formed by the conventional method is employed in a window layer of a p-i-n type amorphous silicon solar cell, there arise problems that photo-electric current generated in an i layer due to the solar radiation cannot be effectively delivered to an external electrode because of low conductivity, and that solar radiation entering the solar cell is absorbed by the window layer (p layer) because of narrow optical energy gap thereof so as not to effectively reach an electrically generating layer (i layer).

SUMMARY OF THE INVENTION

It is an object of the present invention to provide a method for forming a SiC film having a wide optical energy gap and a high conductivity, which is capable of being stacked over a large area uniformly.

According to the present invention, a silicon carbide layer is stacked on a substrate by setting the hydrogen dilution ratio $\gamma$ ($\gamma=[H]/\{[S]+[C]\}$) which is the ratio of the partial pressure[H] of the hydrogen gas to the sum of the partial pressure[S] of the silicon-containing gas and the partial pressure[C] of the carbon-containing gas, to not less than 10, and the carbon mixing ratio $k$ ($k=[C]/\{[S]+[C]\}$) to 0.5 or less, keeping the substrate temperature at 180° C. or higher, and generating plasma at a rf power density of from 80 mW/cm$^2$ to 350 mW/cm$^2$ under a reaction pressure of 0.5 torr or less.

The SiC film forming according to the present invention exhibits a wide optical energy gap of 1.8 eV or more and a high dark-conductivity of $10^{-6}$Scm$^{-1}$ or more. And the Raman spectrum thereof peaks at around 520 cm$^{-1}$, which shos the existence of microcrystalline silicon, or around 750 cm$^{-1}$, which shows the existence of microcrystalline silicon carbide.

Namely, the method according to the present invention enables the formation of microcrystalline silicon($\mu$c-Si) or microcrystalline silicon carbide($\mu$c-SiC) which is distributed in SiC like islands. This microcrystalline silicon or silicon carbide exhibits an extremely high electrical conductivity so as to increase the dark-conductivity of the overall SiC film.

As described above, according to the present invention, a SiC semiconductor film having a wide optical energy gap and a high electrical conductivity can be obtained. Therefore, this SiC semiconductor film can be applied to solar cells or the like so as to improve the photo-electric conversion efficiency thereof.

Moreover, the adoption of rf glow discharge method enables uniform formation of a SiC semiconductor film over a large area, facilitates the in-lined continuous formation of p-i-n layers of the solar cell, does not require any such special devices as to highly vacuumize a reaction chamber and heat the same to a high temperature, and accordingly is economical.

BRIEF EXPLANATION OF THE DRAWINGS

FIG. 1 is a characteristic graph showing the relation between the rf power and the dark-conductivity and the optical energy gap;

FIG. 5 is a characteristic graph showing the relation between the hydrogen dilution ratio and the dark-conductivity and the optical energy gap in a nondoped SiC film according to the present invention;

FIG. 8 is a characteristic graph of the solar cell to which the SiC film formed according to the present invention is applied.

DETAILED DESCRIPTION OF THE EMBODIMENT

Figure 2:
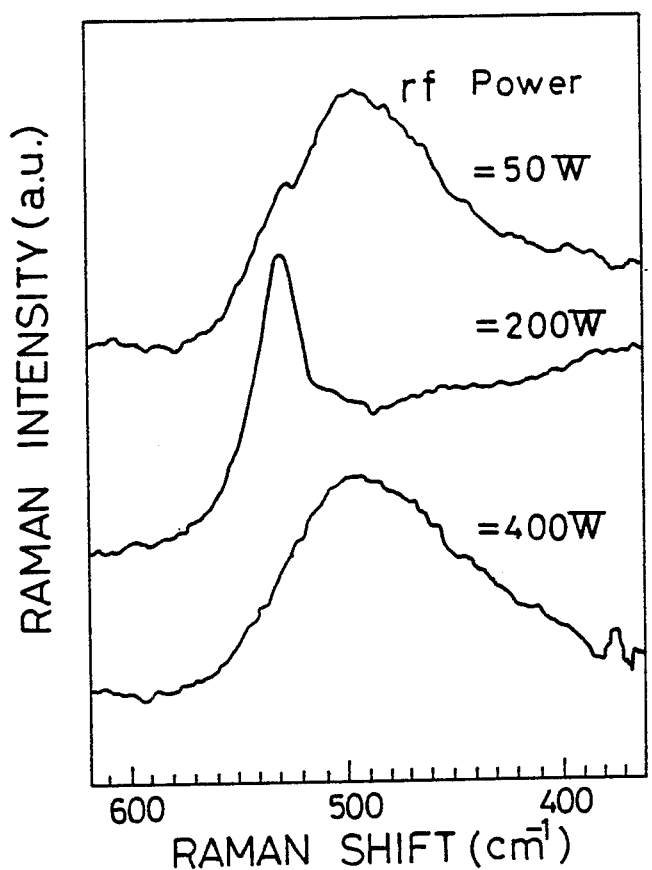
FIG. 2 is a characteristic graph showing the relation between the rf power and the Raman spectra.

In the method according to the present invention, a mixture of a silicon-containing gas, a carbon-containing gas and a hydrogen gas is employed as a material gas.

The silicon-containing gas includes silane gas such as monosilane(SiH$_4$) gas, disilane(Si$_2$H$_6$) gas, trisilane(Si$_3$H$_6$) gas and trimethylsilane(SiH(CH$_3$)$_3$) gas. Alternatively, the silicon-containing gas may include gas produced by substituting methyl group, ethyl group, fluorine or chlorine for one part or all of hydrogen atoms within the above silane gas.

The carbon-containing gas preferably includes methane gas.

Alternatively, the carbon-containing gas may include chain hydrocarbon such as acetylene, ethylene, and the like, compound of element of group IIIa, such as trimethylboron, with hydrocarbon, gas obtained by substituting fluorine or chlorine for one part or all of hydrogen atoms within the above chain hydrocarbon gas or compound gas, ketone such as acetone($CH_3COCH_3$), or alcohol such as ethylalcohol($C_2H_5OH$).

The hydrogen dilution ratio $\gamma$ in the material gas can be expressed by the following equation (1):

$$\gamma = [H]/\{[S]+[C]\} \quad (1)$$

where [H] is the partial pressure of hydrogen gas, [S] is the partial pressure of the silicon-containing gas and [C] is the partial pressure of the carbon-containing gas.

Hydrogen promotes the formation of microcrystalline silicon or silicon carbide. When $\gamma$ is 60 or more, the dark-conductivity is drastically improved, but when the hydrogen dilution ratio is less than 60, desirable dark-conductivity cannot be obtained. Preferably hydrogen dilution ratio $\gamma$ is equal to or above 70, and more preferable ratio is from 70 to 110.

The carbon mixing ratio k is expressed by the following equation (2):

$$k = [C]/\{[S]+[C]\} \quad (2)$$

where [C] and [S] designate the same meanings as those of the equation (1). When the carbon mixing ratio k is too large, the formation of microcrystalline is obstructed. Therefore, k is set to 0.5 or less, preferably 0.35 or less.

The substrate temperature is normally 180° C. or higher. At a substrate temperature of less than 180° C., high dark-conductivity cannot be obtained. The substrate temperature is preferably 200° C. or higher, and more preferably 200° C. to 300° C.

The rf power density to be supplied to a reaction chamber is normally from 80 to 350 mW/cm$^2$, and preferably 170 to 340 mW/cm$^2$. At the rf power density of less than 80 mW/cm$^2$, or more than 350 mW/cm$^2$, dark-conductivity decreases. And the preferable frequency of the rf power is 13.56 MHz.

The reaction pressure must be 0.5 torr or less. When the reaction pressure is more than 0.5 torr, the number of collision of ions against the substrate is reduced so that microcrystalline is not formed.

According to the present invention, the SiC film may be subjected to the valence electron control to p type by doping the SiC film with boron, for example. in order to improve the dark-conductivity.

Impurity for doping is not limited to boron. Other elements of groups IIIa can achieve similar effect to that of the case of boron. In the case that the concentration of the above described impurity ([B]/{[S]+[C]} where [B] is the partial pressure of the gas containing elements of group IIIa, [S] is the partial pressure of silicon-containing gas and [C] is the partial pressure of carbon-containing gas) is less than 0.05%, any effect due to the addition of the impurity is not observed. In the case of 4.0% or more, the optical energy gap is remarkably lowered, and accordingly preferable result cannot be obtained. Normally, the valence electron control is performed at a impurity concentration of about 0.5 through 3.0%.

EXAMPLE 1

Into a parallel-plated rf glow discharge CVD device provided with a circular discharge electrode of a diameter of 31 cm (electrode area $\approx$ 755 cm$^2$) is supplied a material gas composed of a mixture of 15 ml/min. of monosilane gas($SiH_4$) diluted with hydrogen gas to a concentration of 10%, 8 ml/min. of methane($CH_4$) gas diluted with hydrogen gas to a concentration of 10%, 10 ml/min. of diboran($B_2H_6$) gas diluted with hydrogen gas to a concentration of 500 ppm, and 300 ml/min. of hydrogen gas for diluting the other gases. In this case, the hydrogen dilution ratio $\gamma$ of this material gas and the carbon mixing ratio k are obtained by using the equations (1) and (2) since the partial pressure of each gas is in proportion to the flow ratio thereof. The obtained hydrogen dilution ratio $\gamma$ of this material gas is about 144 and the carbon mixing ratio k is 0.35. And the gas pressure of the reaction chamber is kept to 0.2 torr and the substrate temperature is kept at 220° C.

By changing the rf power to be supplied to the CVD device from 50 W to 400 W, the effect of the rf power on the optical energy gap Eg and the electrical conductivity of the formed SiC film is examined.

The results are shown in FIG. 1. As is apparent from FIG. 1, samples formed with the rf power of less than 60 W, that is rf power density (=rf power/electrode area) of less than 80 mW/cm$^2$, exhibit low dark-conductivity of $10^{-7}$Scm$^{-1}$ or less.

And samples formed with the rf power of larger than 270 W (that is rf power density of 350 mW/cm$^2$) also exhibit low dark-conductivity of $10^{-7}$Scm$^{-1}$ or less. In contrast, samples formed with the rf power of 60 to 270 W (that is rf power density of 80 to 350 mW/cm$^2$) exhibit high dark-conductivity of $10^{-6}$Scm$^{-1}$ or more, and samples formed with the rf power of 130 to 260 W (that is rf power density of 170 to 340 mW/cm$^2$) exhibit especially high dark-conductivity of $10^{-3}$Scm$^{-1}$ or more.

Next, samples formed with the rf power of 50 W, 200 W and 400 W respectively, are analyzed by Raman spectroscopic analysis method. The analysis results are shown in FIG. 2. As is apparent from FIG. 2, the Raman spectrum of the sample formed with the rf power of 200 W peaks at around 520 cm$^{-1}$. This shows the presence of the microcrystalline silicon in the sample. And the TEM image of this sample is observed by means of a transmission electron microscope. In the observed TEM image, islands-shaped microcrystalline phase which shows the presence of microcrystalline silicon is confirmed. Moreover, spots appear on the electron diffraction image observed at the same time.

On the other hand, in case of samples formed with low rf power of 50 W or high rf power of 400 W, the Raman spectra thereof do not peak at around 520 cm$^{-1}$, but only exhibit a well known broad pattern indicating the presence of a uniform amorphous phase.

And in the case of the rf power of 50 W and 400 W, islands-shaped microcrystalline phase is not observed in the TEM image thereof. Moreover, the electron diffraction images thereof have only a halo pattern. These results show that these samples include no microcrystalline phase but include only uniform amorphous phase.

In the conventional method for forming a SiC semiconductor film by rf glow discharge method, a uniform amorphous phase is formed throughout the film with a relatively low rf power of 60 W or less. Accordingly, it is not known such a method as to form a SiC semiconductor film of which the Raman spectrum peaks at around 520 cm$^{-1}$, and the dark-conductivity is as high as $10^{-3}$Scm$^{-1}$ or more.

Moreover, it is not known that a uniform amorphous phase is also formed throughout the formed film when the supplied rf power is too large.

EXAMPLE 2

Into the CVD device similar to that of Example 1 is supplied a mixture gas of 30 ml/min. of monosilane gas diluted with hydrogen gas to a concentration of 10%, 3 ml/min. of methane gas diluted with hydrogen gas to a concentration of 10% and 10 ml/min. of diboran gas diluted with hydrogen gas to a concentration of 500 ppm. And to the mixture gas is added hydrogen gas for diluting the other gases at the flow ratio of 0 through 40 ml/min. for examining the effect of the hydrogen dilution ratio $\gamma$ on the dark-conductivity of the formed SiC film. The substrate temperature is 220° C., the gas pressure of the reaction chamber is 0.3 torr and the rf power is 200 W.

Figure 3:
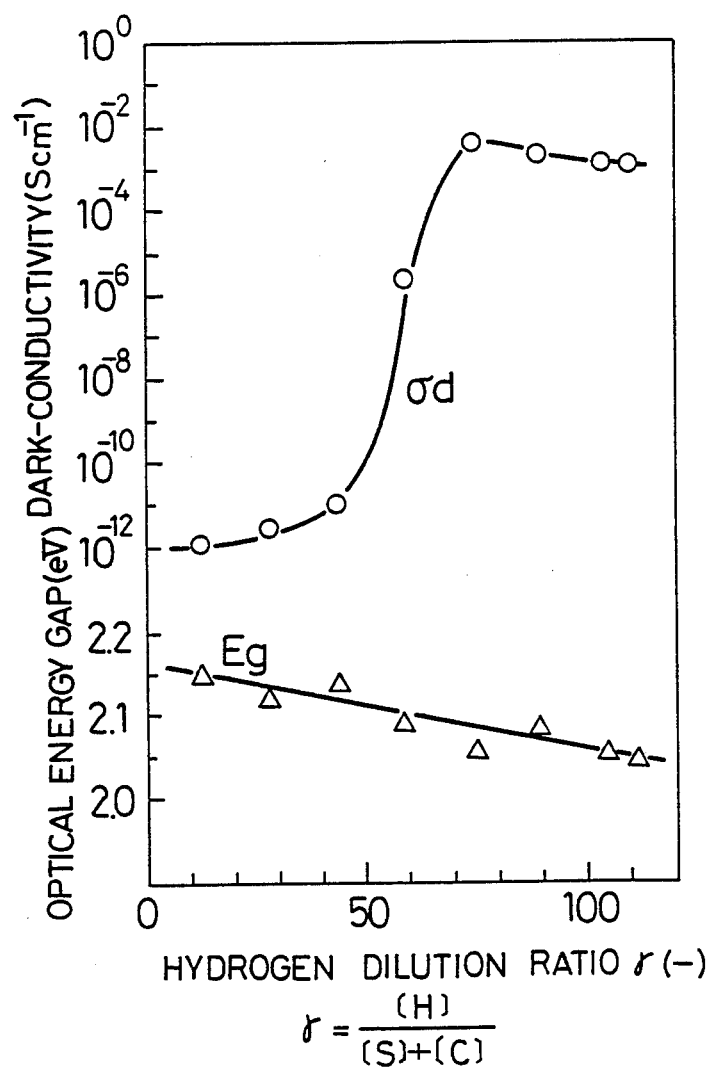
FIG. 3 is a characteristic graph showing the relation between the hydrogen dilution ratio of a material gas and the dark-conductivity and the optical energy gap.

The examination results are shown in FIG. 3. As is apparent from FIG. 3, the samples of which the hydrogen dilution ratio $\gamma$ is less than 60 exhibit only a low dark-conductivity of not more than $10^{-7} Scm^{-1}$. In contrast, the samples of which the hydrogen dilution ratio $\gamma$ is 60 or more exhibit drastically improved dark-conductivity. Particularly when the hydrogen dilution ratio $\gamma$ is 70 or more, high dark-conductivity of $10^{-3} Sm^{-1}$ or more is obtained. And the Raman spectra of these samples exhibiting high dark-conductivity peak at around 520 $cm^{-1}$. And the Raman spectra of the samples having a hydrogen dilution ratio $\gamma$ of less than 60 show only a broad pattern indicating the presence of an amorphous phase, accordingly, no peak appears at around 520 $cm^{-1}$.

EXAMPLE 3

Figure 4:
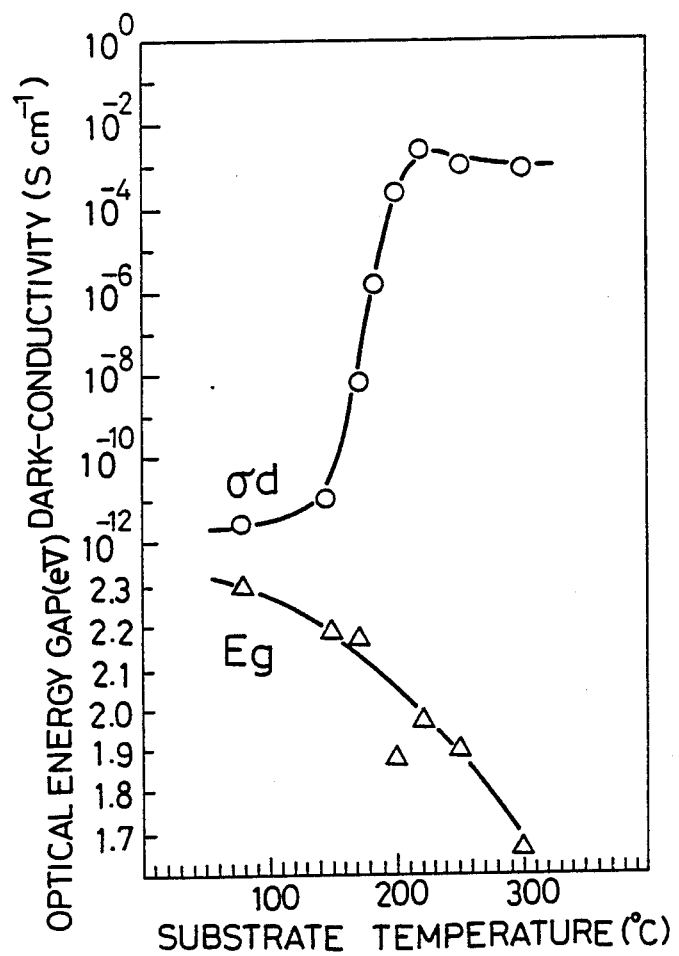
FIG. 4 is a characteristic graph showing the relation between the substrate temperature and the dark-conductivity and the optical energy gap.

SiC films are formed at a different substrate temperature. And the effect of the substrate temperature on the dark-conductivity and the optical energy gap of the formed SiC films is examined. The results are shown in FIG. 4. The flow ratio of the material gas and the gas pressure of the reaction chamber are equal to those of Example 1, and the rf power supplied to the CVD device is 200 W.

As is apparent from FIG. 4, at a low substrate temperature of less than 180° C., dark-conductivity is not obtained, but at a high substrate temperature of not less than 180° C., the dark-conductivity is drastically improved. And the Raman spectra of samples exhibiting dark-conductivity as high as $10^{-3} Scm^{-1}$ or more at the substrate temperature of 200° C. or more, peak at around 520 $cm^{-1}$. In contrast, the Raman spectra of samples formed at the substrate temperature of less than 180° C. has a broad pattern indicating the presence of the amorphous phase, and accordingly no peak appears at around 520 $cm^{-1}$.

EXAMPLE 4

SiC films are formed under the same conditions as those of Example 1 except for the flow ratio of methane gas. And the effect of the carbon mixing ratio k on the dark-conductivity is examined. The substrate temperature is 220° C. similarly to Example 1.

Samples formed at the carbon mixing ratio k of 0.5 or less exhibit dark-conductivity of $10^{-6} Scm^{-1}$ or more, and samples formed at the carbon mixing ratio k of 0.35 or less exhibit dark-conductivity as high as $10^{-3} Scm^{-1}$ or more. But the films cannot be formed at the carbon mixing ratio k of larger than 0.5.

The Raman spectra of the samples exhibiting high dark-conductivity peak at around 520 $cm^{-1}$. In contrast, the Raman spectra of the samples formed at the carbon mixing ratio k larger than 0.5 have a broad pattern indicating the presence of the amorphous phase.

Figure 9:
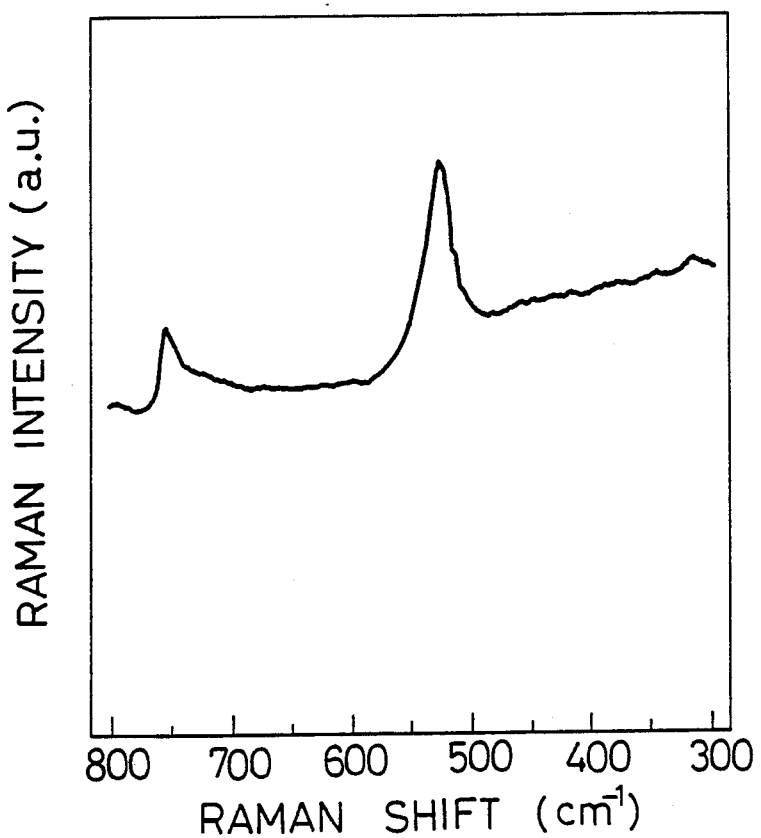
FIG. 9 is a characteristic graph showing the Raman spectrum of a SiC formed according to the present invention.

Moreover, by forming SiC films with the carbon mixing ratio of 0.3 through 0.4 at a comparatively high temperature and high power, the Raman spectra of the formed SiC films peak at around 750 $cm^{-1}$ as well as around 520 $cm^{-1}$ as shown in FIG. 9. These films exhibit an electrical conductivity nearly equal to or slightly larger than that of the films of which the Raman spectra peak at only around 520 $cm^{-1}$.

EXAMPLE 5

SiC films are formed under the same conditions as those of Example 2 except for the flow ratio of diborane gas. And the effect of the hydrogen dilution ratio $\gamma$ on the dark-conductivity of the nondoped SiC films is examined. The results are shown in FIG. 5. At this time, diborane gas for doping is not supplied.

As is apparent from FIG. 5, the samples formed at the hydrogen dilution ratio $\gamma$ of not less than 60 exhibit drastically improved dark-conductivity as high as not less than $10^{-6} Scm^{-1}$. The Raman spectra of these samples peak at around 520 $cm^{-1}$. In contrast, the samples formed at the hydrogen dilution ratio $\gamma$ of less than 60 exhibit low dark-conductivity of $10^{-10} Scm^{-1}$ or less, and the Raman spectra thereof do not peak at around 520 $cm^{-1}$.

Figure 6:
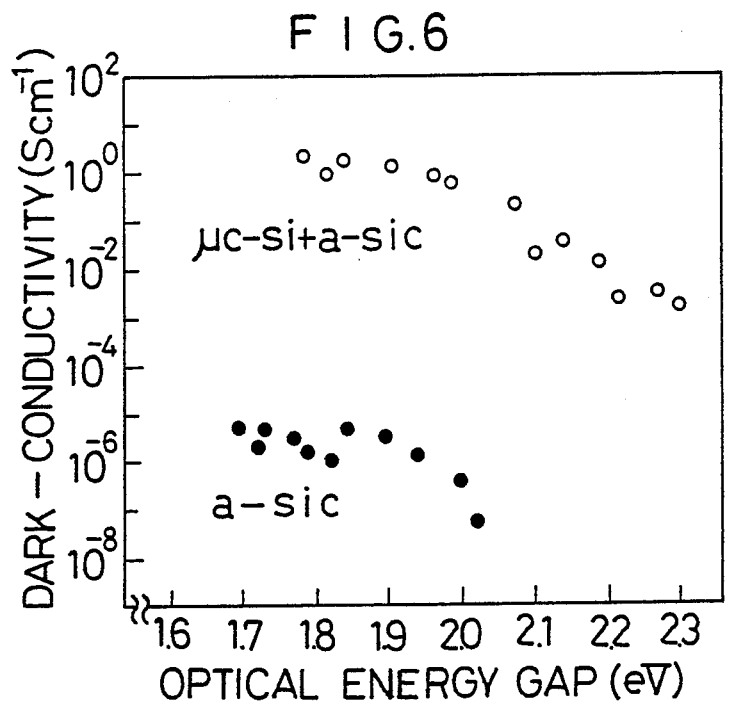
FIG. 6 is a characteristic graph showing the relation between the optical energy gap and the dark-conductivity in a doped SiC film according to the present invention.

The relation between the optical energy gap and the dark-conductivity of the SiC semiconductor films ($\mu c$-Si+a-SiC) formed by the method according to the present invention is shown in FIG. 6. In FIG. 6, the relation between the optical energy gap and the dark-conductivity of the SiC films(a-SiC) formed by the well known method with the relatively low rf power density of 100 $mW/cm^2$ or less, which includes only an amorphous phase, is also shown for comparison.

EXAMPLE 6

Figure 7:
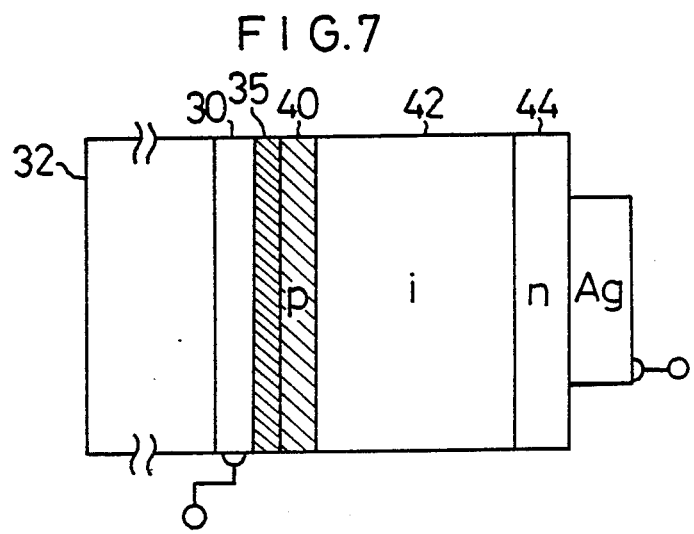
FIG. 7 is a schematic view of a solar cell to which the SiC film formed according to the present invention, is applied.

An amorphous solar cell is formed on a glass substrate 32 coated with a transparent electrode 30 by using a p-type SiC film(Eg=2.3 eV, $\sigma d = 10^{-3} Scm-$), formed by the method according to the present invention, as shown in FIG. 7.

In FIG. 7, between the transparent electrode 30 and the p-type SiC film 40 of a thickness of about 200 Å is formed a buffer layer 35 of an electrically conductive zinc oxide and a thickness of about 100 Å. This buffer layer 35 serves to prevent the transparent electrode 30 from being blacken in forming the p-type SiC film of a high dark-conductivity.

And an i-type a-SiC film 42 having a thickness of about 500 Å and a n-type microcrystalline Si film 44 having a thickness of about 300 Å are formed by a well known method.

The current-voltage characteristics of this solar cell, which is measured under AM 1.5 simulated sunlight of 100 $mW/cm^2$, are shown by a curve B in FIG. 8. In FIG. 8, the current-voltage characteristic of a comparative solar cell A, of which the p layer is composed of a well known p-type amorphous SiC film (Eq=2.0 eV, $\sigma d = 2 \times 10^{-5} Scm^{-1}$) and the i-layer and n-layer are formed under the same conditions as those of this examle, is also shown for comparison. The p layer of the comparative solar cell A has a thickness of 150 Å and no buffer layer is formed between the p layer and transparent electrode.

In Table 1, the characteristics of the comparative solar cell A and the solar cell B according to this example, are shown.

TABLE 1

| | Open Circuit Voltage Voc (mV) | Short Circuit Current Jsc (mA/cm) | Fill Factor (FF) (%) | Photo-Electric Conversion Efficiency ($E_{ff}$) |
|---|---|---|---|---|
| A | 875 | 17.8 | 66.0 | 10.3 |
| B | 950 | 17.8 | 67.2 | 11.4 |

As is apparent from Table 1 and FIG. 8, the open circuit voltage(Voc) of the solar cell B is 950 mV, which is larger than that of the solar cell A (875 mV). This difference results from that the p-type SiC film formed by the method of the present invention, has an optical energy gap Eg larger than that of the conventional p-type amorphous SiC film.

And the fill factor (FF) of the solar cell B is improved from 66.0% to 67.2% as compared with the solar cell A. This is considered to result from the improvement in electrical conductivity. The increase in open circuit voltage (Voc) and the improvement in fill factor (FF) enable the improvement in the photo-electric conversion efficiency $E_{66}$ of the solar cell B by 10% or more as compared with that of the conventional solar cell A.

What is claimed is:

1. A method for forming a silicon carbide semiconductor film by utilizing radio frequency glow discharge, comprising the steps of preparing a material gas composed of a mixture of a silicon-containing gas, a carbon-containing gas and a hydrogen gas, said material gas having a carbon mixing ratio $k(k=[C]/\{[S]+[C]\}$ where [C] is the partial pressure of the carbon-containing gas, [S] is the partial pressure of the silicon-containing gas) of 0.5 or less, and a hydrogen dilution ratio $\gamma$ ($\gamma=[H]/\{[S]+[C]\}$ where [H] is the partial pressure of the hydrogen gas) of 60 or more; supplying said material gas to a substrate; generating plasma at a substrate temperature of 180° C. or more under a gas pressure of 0.5 torr or less with radio frequency power density of from 80 to 300 mW/cm² whereby the silicon carbide semiconductor film is stacked on said substrate.

2. A method according to claim 1, wherein said silicon-containing gas is one of silane gas and a gas obtained by substituting one of methyl group and ethyl group for at least one part of hydrogen atoms of said silane gas.

3. A method according to claim 1, wherein said silicon-containing gas is one of silane gas and a gas obtained by substituting one of fluorine and chlorine for at least one part of hydrogen atoms of said silane gas.

4. A method according to claim 1, wherein said material gas is further composed of 0.05 to 4% of a gas containing group IIIa elements to control the valence electron of the silicon carbide semiconductor film to p-type, k is 0.35 or less, $\gamma$ is 70 or more, the substrate temperature is 200 C. or higher, and the radio frequency power density is 170 to 340 mW/cm².

5. A method according to claim 4, wherein $\gamma$ is 70 to 110 and the substrate temperature is 200° to 300° C.

* * * * *